(12) United States Patent
Thron et al.

(10) Patent No.: US 6,477,477 B1
(45) Date of Patent: Nov. 5, 2002

(54) EXTENDED BASE BAND MULTICARRIER SYSTEM

(75) Inventors: Christopher P. Thron, Austin, TX (US); T. Keith Blankenship, Schaumburg, IL (US); Michael B. Thomas, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 243 days.

(21) Appl. No.: 09/592,524

(22) Filed: Jun. 12, 2000

(51) Int. Cl.[7] .................. G01D 18/00; G01D 21/00; G01M 19/00; G01P 21/00
(52) U.S. Cl. .......................................... 702/86
(58) Field of Search ............... 702/86; 330/149; 332/18, 37; 364/514; 375/60; 455/208, 295

(56) References Cited

U.S. PATENT DOCUMENTS

| | | | | |
|---|---|---|---|---|
| 4,268,802 A | * | 5/1981 | Fisher et al. | 332/37 |
| 4,291,277 A | * | 9/1981 | Davis et al. | 330/149 |
| 4,329,655 A | * | 5/1982 | Nojima et al. | 330/149 |
| 4,373,209 A | * | 2/1983 | Kaneda | 455/208 |
| 4,383,334 A | * | 5/1983 | Epsom | 455/295 |
| 4,412,337 A | * | 10/1983 | Bickley et al. | 375/60 |
| 4,462,001 A | * | 7/1984 | Girard | 330/149 |
| 4,536,846 A | * | 8/1985 | Raychaudhuri et al. | 364/514 |
| 4,554,514 A | * | 11/1985 | Whartenby | 330/149 |
| 4,700,151 A | * | 10/1987 | Nagata | 332/18 |
| 5,049,832 A | * | 9/1991 | Cavers | 330/149 |

OTHER PUBLICATIONS

Texas Instruments, Dec. 20, 1998, Application note GC2011–AN9804, Upconveritng signals with the GC2011 for easier Digital to Anolag conversion.*

* cited by examiner

Primary Examiner—John S. Hilten
Assistant Examiner—Aditya Bhat
(74) Attorney, Agent, or Firm—James L. Clingan, Jr.

(57) ABSTRACT

A method for linearizing an amplifier to produce an amplified output signal from a set of carrier frequencies is disclosed in which a set of digital baseband signals corresponding to the set of carrier frequencies are combined to produce an extended digital baseband signal. Look-up values are then derived from the power values of the extended digital baseband signal and applied to a look-up table to obtain predistortion values. One or more predistorted signals are then produced by complex mixing the predistortion values with one of the set of extended digital baseband signals. The predistorted signal(s) are then amplified to produced an output signal which is linearly related to the set of digital baseband signals. In one embodiment, linearly combining the set of digital baseband signals includes complex mixing individual digital baseband signals of the set of digital baseband signals with trigonometric signals to produce complex mixed signals and adding the complex mixed signals to produce the extended digital baseband signal. Producing one or more predistorted signals may include upconverting the predistorted signals synchronously when the predistorted signals are a complex mixing of the predistortion values and the set of digital baseband signals. In one embodiment, the look-up table is a function of pre-measured calibration data.

20 Claims, 10 Drawing Sheets

EXTENDED BASE BAND MULTICARRIER SYSTEM

RELATED APPLICATIONS

The subject matter of the present application is related to the subject matter of co-pending U.S. patent application entitled "Digital Predistortion For Amplifiers," Thron et al., which shares a common assignee with the present application and is incorporated by reference herein.

FIELD OF THE INVENTION

The present application is related to the field of signal amplification and more particularly to a system for predistorting multiples signals prior to amplification to achieve a more linear amplification.

BACKGROUND OF THE INVENTION

In an ideal linear amplifier, the output power ($V_{OUT}^2$) is equal to the input power ($V_{IN}^2$) times a constant K that does not vary with the input power. Similarly, the input signal phase ($\Theta_{IN}$) is equal the output signal phase ($\Theta_{OUT}$). In an actual amplifier, however, both the output power and the output phase vary from the ideal output power and the ideal output phase. Typically, the variation from the ideal output power and phase is a function of input power. Referring to FIGS. 1 and 2, diagrams of output power and carrier phase rotation as a function of input power for a non-ideal (real) amplifier are depicted. In FIG. 1, the output power of an actual amplifier is diagramed as a function of input power. The response of an ideal amplifier is represented by the straight line 100 where the slope of line 100 is equal to the desired gain of the amplifier denoted by K. FIG. 1 further indicates a real response curve 102 representing the output power of a real amplifier as a function of input power.

Typically, real response curve 102 includes three sections as indicated by reference numerals 104, 106, and 108. A first region 104, referred to herein as linear region 104, typically includes portions of response curve 102 representing input powers in the vicinity of zero. In first region 104, the response curve 102 closely tracks the ideal response curve 100. Thus, in linear region 104, the real amplifier represented by response curve 102 closely resembles an ideal amplifier. As the input power is increased, however, a real amplifier typically enters a second (compression) region 106 in which response curve 102 begins to roll off of ideal response curve 100. As the input power is further increased, the real amplifier represented by response curve 102 enters a third (saturation) region 108 in which the output power is essentially independent of input power as the real amplifier reaches a maximum obtainable output power.

Referring now to FIG. 2, response curve 201 represents the carrier phase rotation of a real amplifier as a function of input power. From inspection of response curve 201, the carrier phase rotation, which indicates the differential between the input signal and the output signal phase, is substantially equal to zero at low input powers indicating little or no phase shift. As the input power is increased, however, the carrier phase rotation increases in magnitude as indicated by the descending slope of response curve 201.

Typically, it is highly desirable to eliminate the non-linearity of real amplifiers represented by response curves 102 and 201 in FIGS. 1 and 2 respectively. Therefore, it would be highly desirable to implement a circuit, method, and system to compensate for the non-linearity associated with real amplifiers such that the output of the amplifier would more closely resemble the output of an ideal amplifier. It would be further desirable if the implemented circuit, method, and system did not significantly increase the cost, complexity, and reliability of the amplification system. It would be still further desirable if the invention were able to accommodate multiple input signals.

DETAILED DESCRIPTION OF THE DRAWINGS

Figure 3:
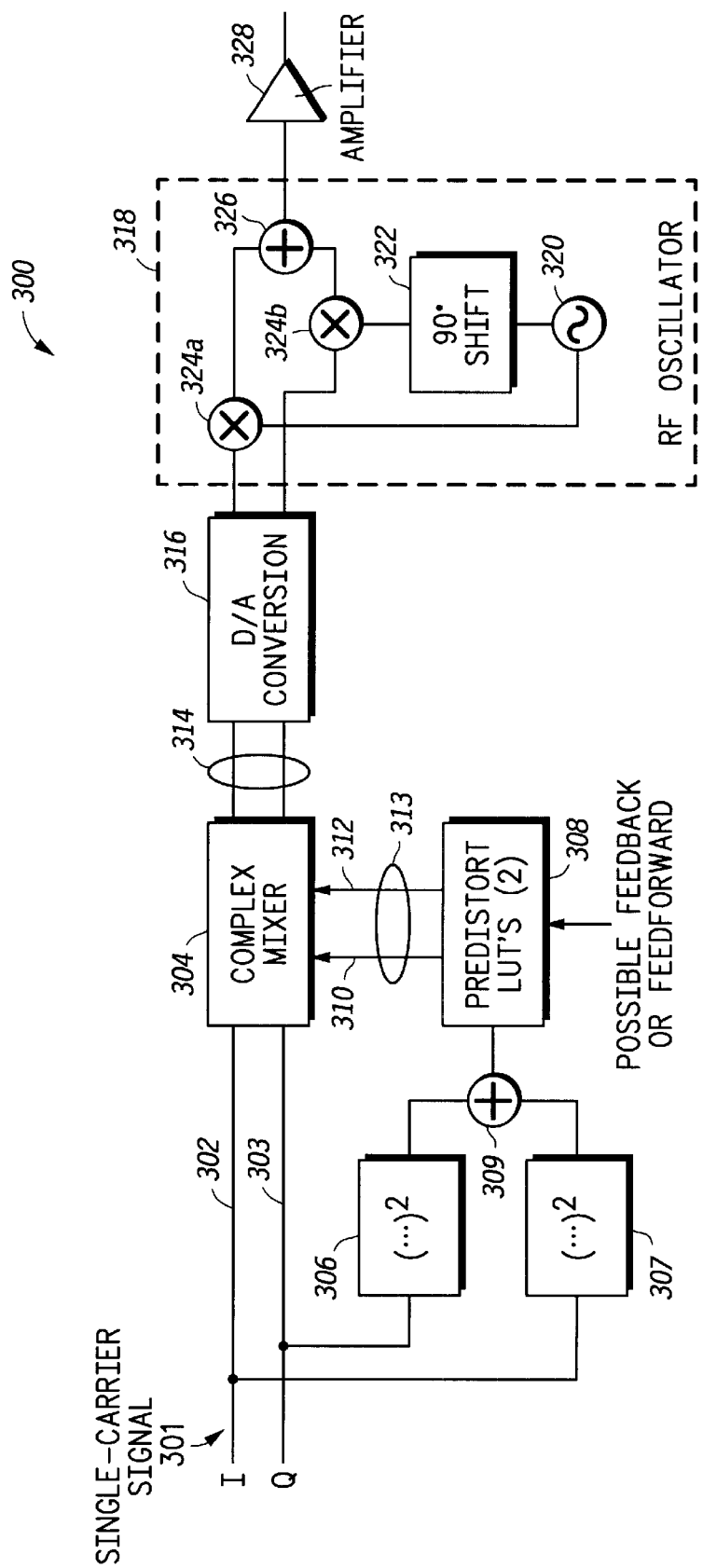
FIG. 3 is a simplified block diagram of a linear amplification system according to one embodiment of the present invention.

Turning now to the drawings, FIG. 3 depicts a block diagram of a system 300 suitable for predistorting a signal prior to amplification to compensate for non-linearities in an amplifier to produce an output that is a substantially linear function of the input signal. As depicted in FIG. 3, system 300 is configured to receive a digital input signal 301 comprised of an in-phase (I) and a quadrature phase (Q) component. The inphase component of input signal 301 is routed to a complex mixer 304 via line 302 while the quadrature phase component of the input signal is routed to complex mixer 304 via line 303. Simultaneously, the inphase component of input signal 301 is received by a first squaring circuit 306 configured to generate an output equal to the square of the received input. Similarly, the quadrature phase of input signal 301 is routed to a second squaring circuit 307. The outputs of circuits 306 and 307 are received by a summing circuit 309 that produces the input to a predistortion look up table (LUT) 308. As will be appreciated to those knowledgeable in the field of communication signals, the input to LUT 308 represents the power of the input signal, which is equal to the sum of the squares of the inphase component and the quadrature phase component of input signal 301.

Predistortion LUT 308 includes a set of values corresponding to various input signal values. In the preferred embodiment, the values in lookup table 308 corresponding to each of the input values represent a factor by which the input signal should be multiplied to produce a distorted input signal represented in FIG. 3 by reference numeral 314. The values in predistortion look up table 308 are preferably such that the predistorted input signal 314, when amplified by amplifier 328, results in an amplified signal from amplifier 328 that is a linear function of the input signal 301.

Thus, system 300 contemplates a method of distorting signal 301 prior to amplification (predistorting) using look-up table 308. The look-up table 308 receives digital input signal samples as look-up values and returns one or more look-up table predistortion factors. The predistortion factors stored in look up table 308 are a function of pre-measured calibration data. The predistortion factors returned by look-up table 308 are then applied to the digital input signal such as input signal 301 to produce a predistorted signal 314. Preferably, the output of the amplifier that receives the predistorted signal, is a linear function of the digital input signal. In one embodiment, LUT's 308, complex mixer 304, and amplifier 328 are implemented as a semiconductor device that includes memory for storing look-up table 308.

Figure 4:
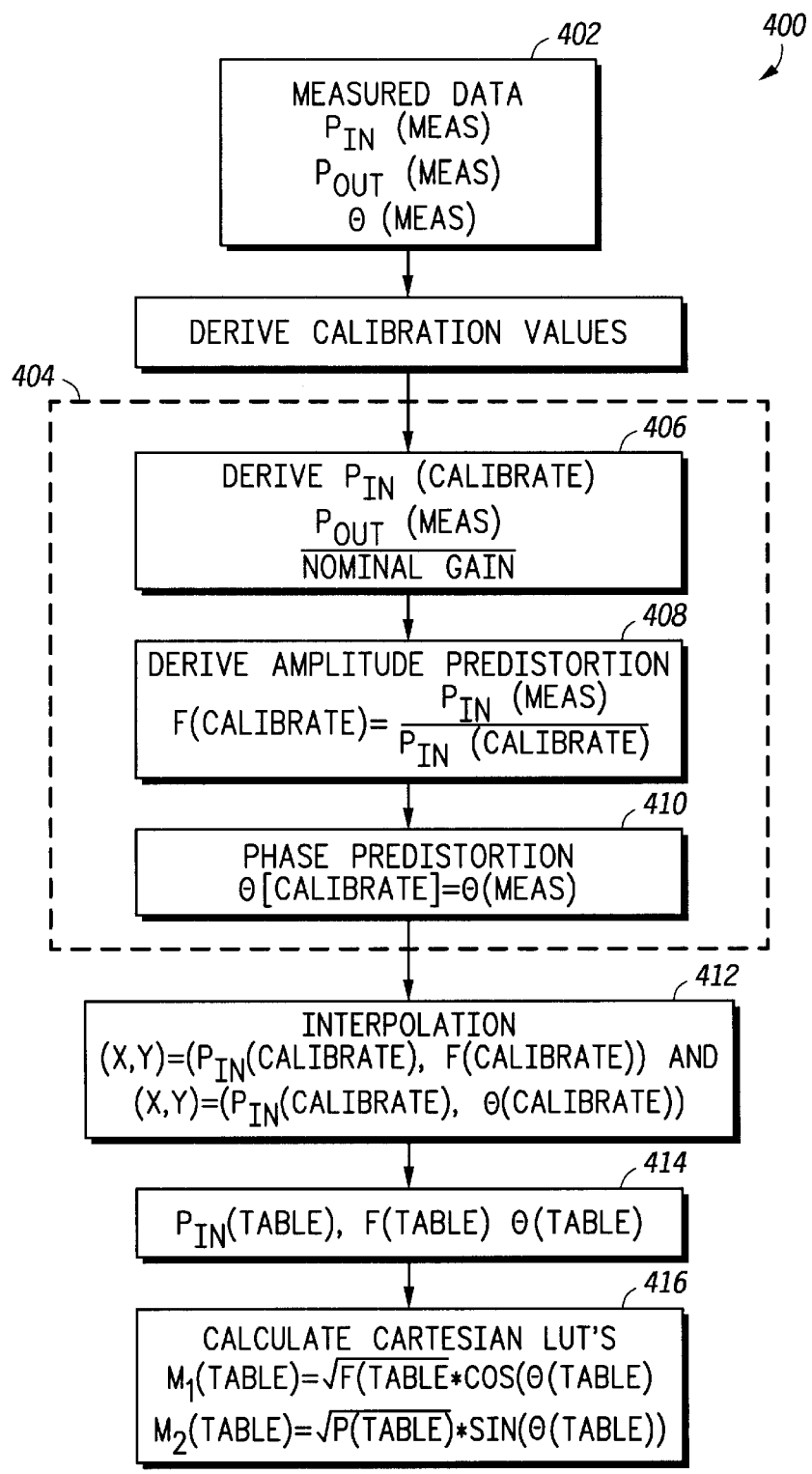
FIG. 4 is a flow diagram of a method for calculating predistortion look up table values according to one embodiment of the invention.

Turning now to FIG. 4, a flow diagram illustrating a method 400 for computing values for predistortion LUT 308 is depicted. Initially, a set of input power values are determined. The determined input power values are then applied to the input of amplifier 328 and the output powers and output phases are measured to obtain pre-measured calibration data points. Each pre-measured calibration data point includes an input power value (Pin(meas)), a measured output power data value (Pout(meas)), and a measured phase data value ($\Theta$(meas)). After obtaining pre-measured calibration data, calibration values for the amplifier are derived (reference numeral 404). To derive calibration values according to the embodiment depicted in FIG. 4, a set of power calibration values P(cal) are calculated (reference numeral 406) by dividing each Pout(meas) value by the nominal gain, where the nominal gain represents the desired linear amplification or the slope of the idealized linear response curve 100 depicted in FIG. 1.

Following the derivation of the P(cal) values, amplitude predistortion values (F(cal)) are calculated (reference numeral 408) by dividing Pin(meas) values by its corresponding P(cal) value. Following the derivation of the F(cal) values, phase predistortion values ($\Theta$(cal)) are derived (reference numeral 410). In the depicted embodiment, the $\Theta$(cal) values are equal to the corresponding $\Theta$(meas) values.

Assume, for example, that it is desirable to obtain a linear amplification of 10 for a given non-ideal amplifier. Assume further that the output of the non-ideal amplifier is 9 volts when the input is 1 volts. For this example, the P(cal) value is equal to Pout(meas) over the nominal gain which is equal in this case to 9/10 or 0.9. The amplitude predistortion factor F is then calculated by dividing Pin(meas), which is 1 in this case, by P(cal), which is 0.9 in this case, to produce an amplitude predistortion value F of approximately 1.11. The phase predistortion is simply the phase of the measured output signal.

Figure 1:
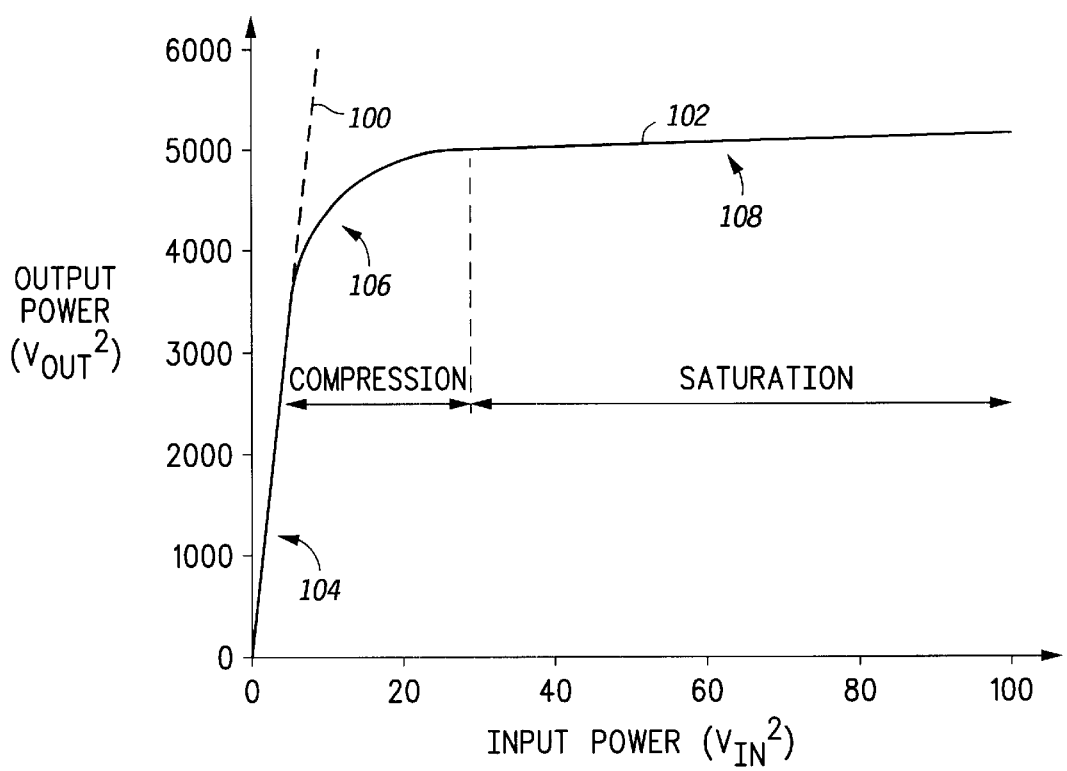
FIG. 1 illustrates output power as a function of input power for a real amplifier and an ideal linear amplifier.
Figure 2:
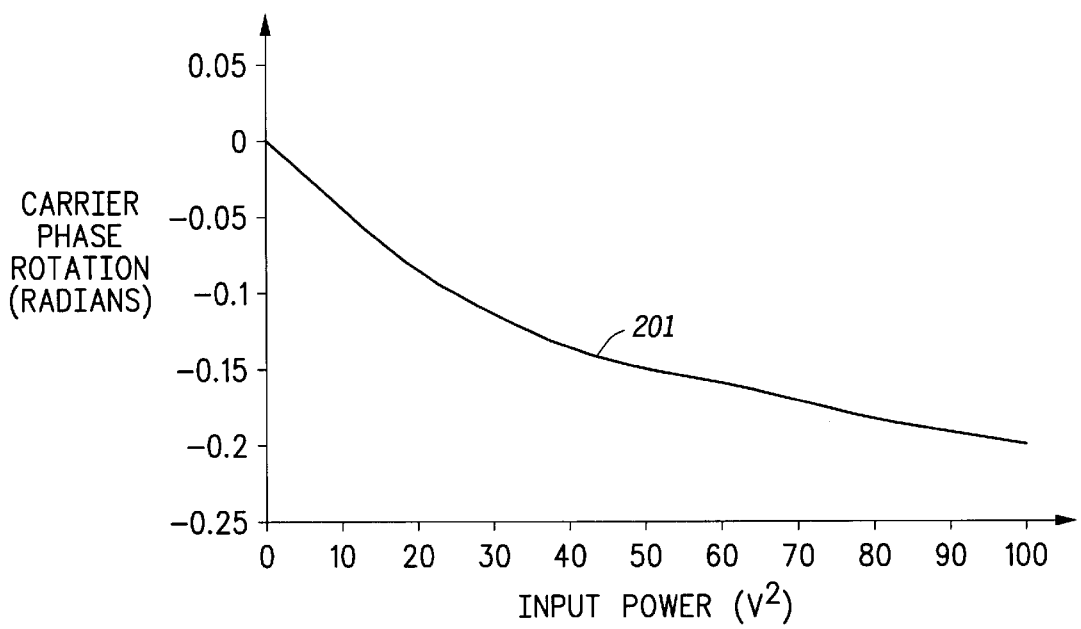
FIG. 2 illustrates the carrier phase rotation of a real amplifier as a function of input power.

Typically, the measurement of data as indicated by reference numeral 402 is performed at various discrete power input values typically optimized to obtain maximum information about the characteristics of the amplifier. More specifically, it is typically desirable to take a higher number of samples in compression region 106 (as indicated in FIG. 1) than in the linear region 104 or the saturation region 108. Fewer sample points are typically required in linear region 104 and saturation region 108 because the output behavior of the amplifier is fairly well defined in these regions.

Following the derivation of calibration values, interpolation as indicated by reference numeral 412 is performed to produce a set of values that will be used in the predistortion look up table 308. Typically, the interpolation contemplated in block 412 of FIG. 4 is accomplished with a spline interpolation technique designed to produce relatively smooth transitions between adjacent sample values. In an embodiment utilizing spline technique to perform interpolation 412, constraining values on the derivative or slope of the line 102 (indicated in FIG. 1) are required. In one embodiment, the constraining values for the slope of line 102 in the vicinity of input power equal to approximately zero is equal to the slope of the line drawn from the origin of the power graph of FIG. 1 to the first sample point of FIG. 1 (i.e., the sample point with an input power closest to zero). For the constraining slope value for large input voltages, one embodiment of the invention assumes that the slope at large input power is approximately equal to zero.

The interpolation performed in block 412 produces values for predistortion look up table 308 (depicted in FIG. 3) for a series of input power values. More specifically, each entry in predistortion lookup table 308 includes a power-in table (Pin(tab)) value, an amplitude-table (F(tab)) value, and a phase-table ($\Theta$(tab)) value as indicated in block 414 of FIG. 4. Using the table values, predistortion look up table 308 generates a pair of scalar values $M_1$ and $M_2$ that are sent to complex mixer 304 of FIG. 3 via lines 310 and 312 respectively. In one embodiment, M1 and M2 are calculated (reference numeral 416) such that $M_1=F(tab)^{1/2}*\cos(\Theta(tab))$ and $M_2=F(tab)^{1/2}*\sin(\Theta((tab))$. In one embodiment, the amplitude predistortion values and the phase predistortion values are polar values that are translated to scalar values $M_1$ and $M_2$ which represent the Cartesian components of a signal that, when multiplied by the input signal, will produce a distorted input signal 314 that is intended to compensate for non-linearities in amplifier 328. When the distorted input signal 314 is ultimately amplified in amplifier 328, the output of amplifier 328 is preferably a linear function of the input signal 301 across the range of input signals required for the intended application.

The use of predistortion look up table 308 beneficially enables system 300 to compensate for non-linearities in the amplifier 328. By determining the contents of predistortion look up table 308 based upon input samples taken from measured values of amplifier 328, the invention eliminates the need to characterize the behavior of amplifier 328 with a polynomial approximation, thereby providing a more accurate compensation system and, ultimately, achieving a more linear output. As indicated previously, the output of predistortion look up table 308, as depicted in FIG. 3 by reference numeral 313, is a representation in Cartesian coordinates of a predistortion factor needed to compensate for the non-linearities in amplifier 328. When the predistortion factor 313 is multiplied by the Cartesian components 302 and 303 of input signal 301 in complex mixer 304, the distorted input signal 314 is produced. The use of Cartesian components for representing predistortion factor 313 in the depicted embodiment enables the use of a relatively simple complex mixer 304 that includes simple scalar multiplication and summation circuits that are well known in the field.

Thus, the predistortion look up table values in predistortion look up table 308 are used to compute compensation factors that are applied to input signal 301 to produce a distorted input signal 314. Graphically, the distorted input signal 314 represents the point on the input power axis of FIG. 1 that results in an output power that is a linear function of the original input power. More specifically, if $P_1$ represents the original input power and $P_D$ represents the corresponding distorted power, the output power produced by amplifier 328 in response to distorted input power $P_D$ is equal to $KP_1$, where K is the slope of linear response curve 100. In other words, the predistortion contemplated by predistortion look up table 308 is used to produce a shift in input power where the magnitude of the shift in the input power is a function of the degree of non-linearity of amplifier 328 at the given input power.

Returning now to FIG. 3, distorted input signal 314 is provided to a digital analog converter (DAC) 316 where the digital signal is converted to a pair of analog signals which are received by an up-converter 318 to convert the signal from baseband to a carrier band. The depicted embodiment of up-converter 318 includes an RF oscillator 320 and a 90 degree phase shifter 322. The signal generated by RF oscillator 320 is multiplied in a first multiplier 324a by a first phase of the output of digital-to-analog converter 316 while the signal output from 90 degree phase shifter 322 is multiplied in a second multiplier 324b by a second phase of digital-to-analog converter 316. The outputs of multiplier 324a and 324b are then summed together in an adder 326 to produce an analog signal that is received by amplifier 328.

Figure 5:
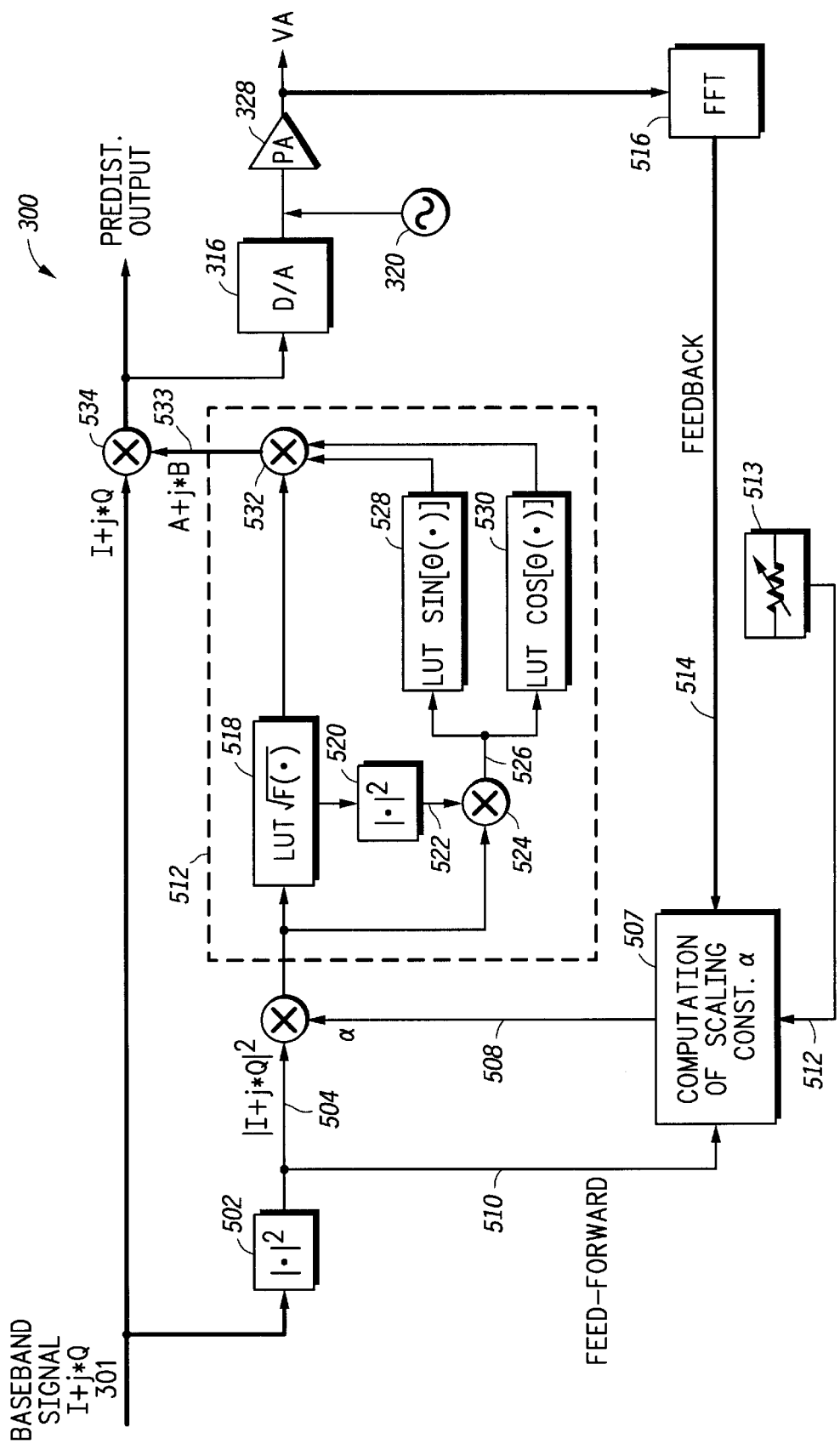
FIG. 5 is a block diagram of an embodiment of an amplification system incorporation adaptive control according to one embodiment of the invention.

Turning now to FIG. 5, an alternative embodiment of system 300 is depicted. In the embodiment depicted in FIG. 5, system 300 includes adaptive control mechanisms to modify the predistortion of input signal 301 to adjust for deviations in amplifier 328. In the depicted embodiment, the input signal 301 is received by first squaring circuit 502 that produces a scalar value indicative of the power of the baseband input signal 301. The output of first squaring circuit 502 is routed via line 504 to a multiplier 506, where it is multiplied by a scaling factor (α) output from scaling circuit 507. Scaling circuit 507 generates α responsive to receiving one or more inputs. In one embodiment, the scaling factor α is a linear constant. In the depicted embodiment, scaling block 507 receives three inputs identified by reference numerals 510, 512, and 514, respectively although it will be appreciated that one or more of these inputs may be eliminated in a particular implementation.

In a feed forward implementation of system 300, the scaling factor α is determined based on the current value of the input power, which is forwarded to scaling block 507 over line 510. This embodiment might be suitable, for example, when the temperature characteristics of amplifier 328 as a function of the input power are known. Variations in the temperature of amplifier 328 alter the characteristics of response curve 102 (depicted in FIG. 1) of amplifier 328. One embodiment of the feed forward implementation contemplates that compensation for alterations in amplifier temperature (or other factors) may be achieved by simply scaling the input power by an appropriate factor prior to predistortion. In a feed forward embodiment of this implementation, the input power received by multiplier 506 over line 504 is also forwarded to scaling block 507, which generates scaling factor α. The scaling factor α is multiplied by the input power in multiplier 506 to produce a compensated power value that is forwarded to predistortion circuit 512 over line 511. In one embodiment, scaling block 507 receives input over line 515 from an environmental temperature sensor 513. Like the feed forward implementation implemented with line 510, the environmental sensor implementation is suitable for generating a compensation factor α in scaling block 507 as a function of temperature. In a third embodiment, scaling block 507 receives feedback input from the output of amplifier 328 through an interim fast Fourier transform (FFT) circuit 516 via line 514. In this implementation, the scaling factor α generated by scaling block 507 may compensate for a variety of characteristics of amplifier 328 including, as examples, temperature dependent characteristics, age dependent characteristics, and any other characteristics of amplifier 328 that vary with time. Thus, the use of the scaling factor α enables the invention to adapt or modify the look-up value in response to changes in the amplification of amplifier 328 using a single constant.

The depicted embodiment of predistortion circuit 512 is configured to vary amplitude compensation based upon temperature (or other parameters) while maintaining phase compensation substantially independent of temperature or other parameters. The amplitude compensation factor is determined using look up table 518, which receives the compensated input power on line 511. By using compensated input power 511 as the input to look up table 518, the temperature dependent variations in the amplitude gain characteristics of amplifier 328 are taken into consideration. Because, however, the appropriate phase correction is presumed to be independent of the temperature (or other time varying) parameter in the depicted embodiment, the input to phase look up tables 528 and 530 is derived from the un-compensated input power (i.e., the power on line 504). More specifically, the input power on line 504 is multiplied by a scalar quantity on line 522 to produce the input to the phase lock up tables 528 and 530 on line 526. The scalar quantity 522 reflects the power of the signal generated by amplitude look up table 518. By multiplying the input power on line 104 by the scalar quantity 522, the input to phase look up tables 528 and 530 on line 526 is indicative of the input power to amplifier 328.

In the embodiment, the look up tables 518, 528, and 530 contain substantially the same values as, and are derived in the same manner as, look up tables 308 in FIG. 3. The compensated amplification factor produced by LUT 518 is then multiplied in multiplier 532 by the appropriate phase factors produced by LUTs 528 and 530 to generate a compensation signal on line 533 that is multiplied by the input signal 301 in multiplier 534. In the preferred embodiment, the compensation factor on line 533 is formatted in a Cartesian format to simplify the multiplication in multiplier 534 as discussed previously with respect to the predistortion factor 313 in FIG. 3. In the preferred embodiment, the amplitude of the compensation factor on lines 533 accounts for the variation of the amplitude characteristics of amplifier 328 with temperature or other parameter while the phase of compensation factor 533 is based upon the pre-compensated input power.

The output of multiplier 534 is received by a digital-to-analog converter 316 and multiplied by a signal generated by an oscillator 320 in the same manner as was described previously with respect to FIG. 3.

Figure 6:
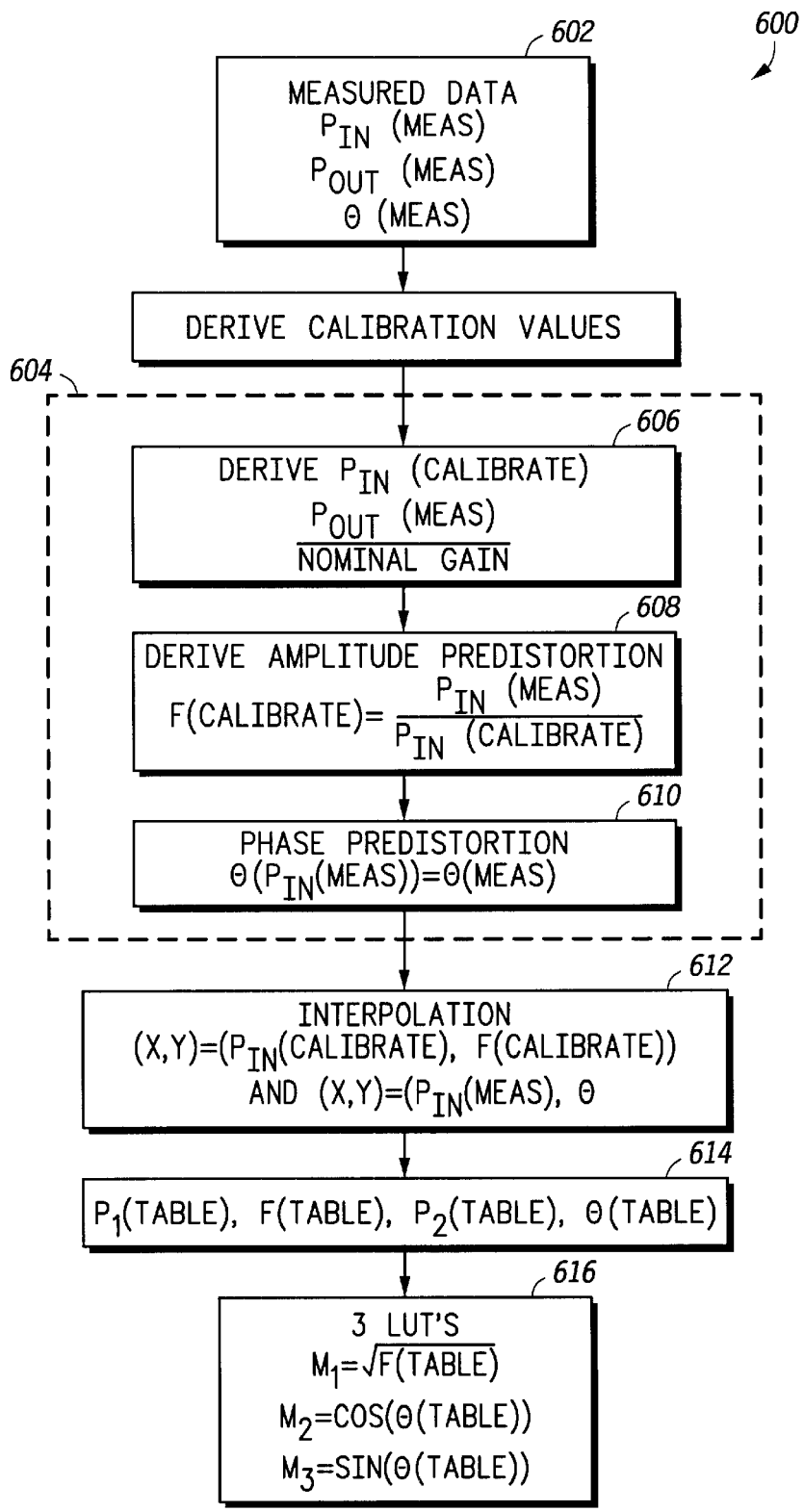
FIG. 6 is a flow diagram of a method for calculating look up table values for the system depicted in FIG. 5.

Turning now to FIG. 6, a flow diagram indicating a method of generating look up table values for the predistortion circuit 512 of FIG. 5 is disclosed. The method 600 depicted in FIG. 6 should be compared with the method 400 depicted in FIG. 4 for deriving look up table values for the circuit of FIG. 3. Initially, in block 602, sample data points are taken for amplifier 328 in a manner similar to block 402 of FIG. 4. Thereafter, Pin(calibrate) values are calculated in block 606 in the same manner as the derivation of Pin (calibrate) values discussed with respect to block 406. Similarly, amplitude predistortion and phase predistortion values FinΘ are derived in the same manner as was described with respect to blocks 408 and 410.

Figure 7:
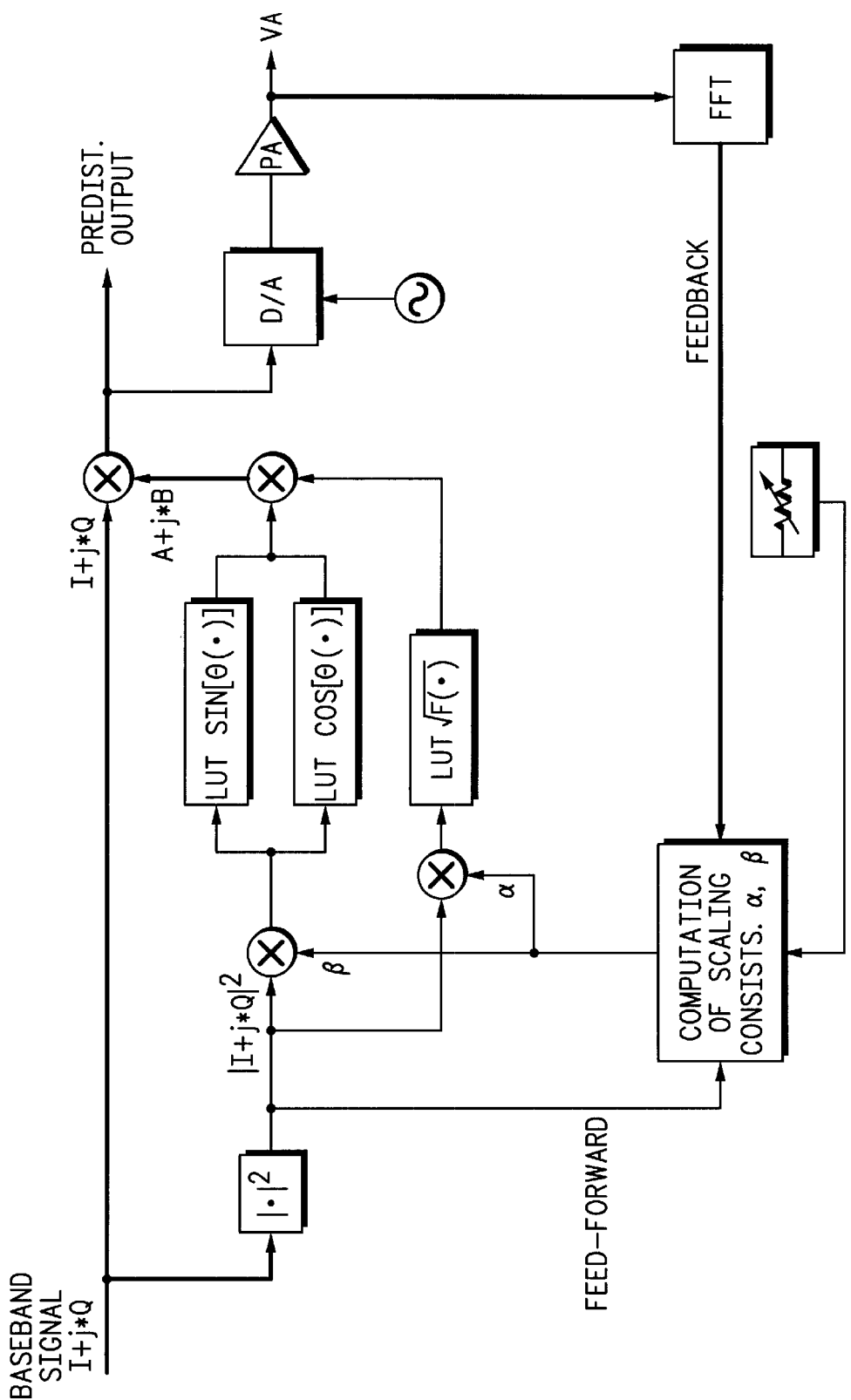
FIG. 7 is a block diagram of an amplification system according to one embodiment of the invention.

FIG. 7 depicts an embodiment of the invention in which separate correction factors are provided for phase and amplitude adjustment. As depicted in FIG. 7, system 300 includes a scaling circuit 707 that receives one or more inputs in the same manner as the scaling circuit 507 described previously with respect to FIG. 5. In addition to generating an amplitude correction factor α, however, scaling circuit 707 generates a phase correction factor β that provides a correction factor for the amplitude LUTs. In this manner, the embodiment of system 300 depicted in FIG. 7 is enabled to adapt or adjust look-up table values in response to changes in amplification of amplifier 328 using a pair of constants to compensate for, as an example, temperature dependent variations in phase distortion as well as amplitude distortion. More specifically, scaling circuit 707 receives one or more inputs including a feed-forward input via line 510, a feedback input vial line 514, and an environmental sensor input via line 513 all as disclosed previously with respect to FIG. 5. Scaling circuit 707 generates a pair of correction factors based upon the received inputs. As their name implies, these correction factors are designed to provide an adjusted input value to the appropriate LUTs to account for time varying changes in the distortion of amplifier 328. The α scaling factor is multiplied by the input power to generate an amplitude adjusted power value to amplitude LUT 518. Similarly, the β scaling factor generated by scaling circuit 707 is multiplied by the input power to provide a phase adjusted input power to phase LUTs 528 and 530. With independent control of the correction factors that are applied to the phase LUTs and the amplitude LUTs, the embodiment of system 300 depicted in FIG. 7 provides ability to accommodate differences between the temperature dependence of the amplitude distortion and the amplitude distortion.

Figure 8:
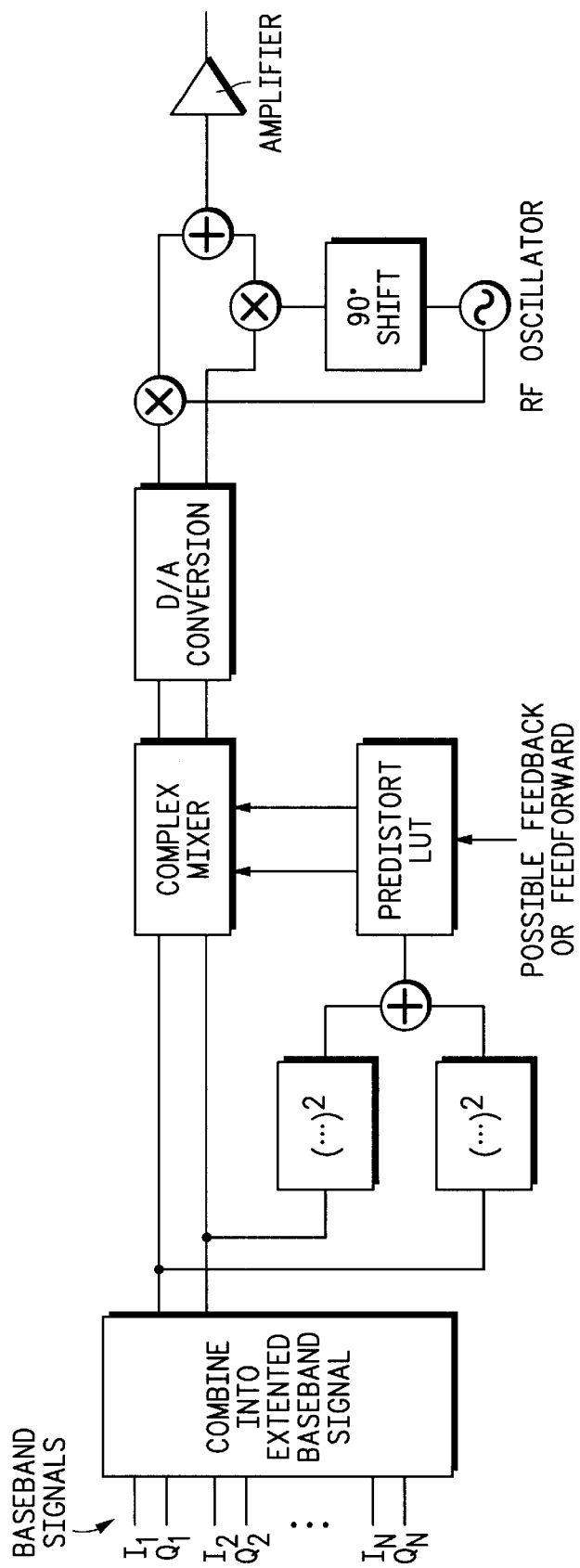
FIG. 8 is a simplified block diagram of a system for predistorting multiple carrier singles according to one embodiment of the invention.

Turning now to FIG. 8, a system 800 according to one embodiment of the present invention is depicted. System 800 extends the single signal predistortion systems described previously with respect to FIGS. 3, 5, and 7 to accommodate multiple input signals. System 800 is suitable for linearly amplifying a set of digital baseband signals by combining the individual baseband signals into an extended baseband signal. The power of the extended baseband signal is then used as the input to a LUT to produce predistortion values that are applied either to the extended baseband signal or to each of the individual baseband signals (as shown in an embodiment depicted in FIG. 10). The predistorted signal(s) are then converted to an analog signal prior to amplification.

In FIG. 8, a set of digital baseband signals 804a, 804b, . . . , 804n (generically or collectively referred to as digital baseband signal(s) 804), each corresponding to a carrier frequency in a set of carrier frequencies, are linearly combined in combining circuit 806 to produced an extended digital baseband signal 808 that includes an inphase component ($I_E$) and a quadrature component ($Q_E$). The IE and QE of extended baseband signals 808 are then squared in respective multiplying circuits 810 and 812 and summed with an adder 814. The output of adder 814 represents the power of extended baseband signal 808. This power value is used to derive look-up values for applying to a look-up table to obtain predistortion values. More specifically, the output of adder 814 is routed to a predistortion lookup table 816 that contains a set of values that are based on the distortion that is created by amplifier 834. The generation of values for lookup table 816 is achieved in substantially the same manner as the generation of lookup table values for the lookup table 308 described previously with respect to FIG. 3. In the preferred embodiment, predistortion lookup table 816 outputs predistortion values in Cartesian format that are mixed with extended baseband signal 808 in complex mixer 818 to produce a distorted extended baseband signal 820. This distorted extended baseband signal is routed to D/A converter 822 to produce an analog output signal 824. The phases of analog output signal 824 are then up-converted by RF oscillator 826 as (discussed in greater detail below) and combined to form a signal that is amplified in amplifier 834.

Figure 9:
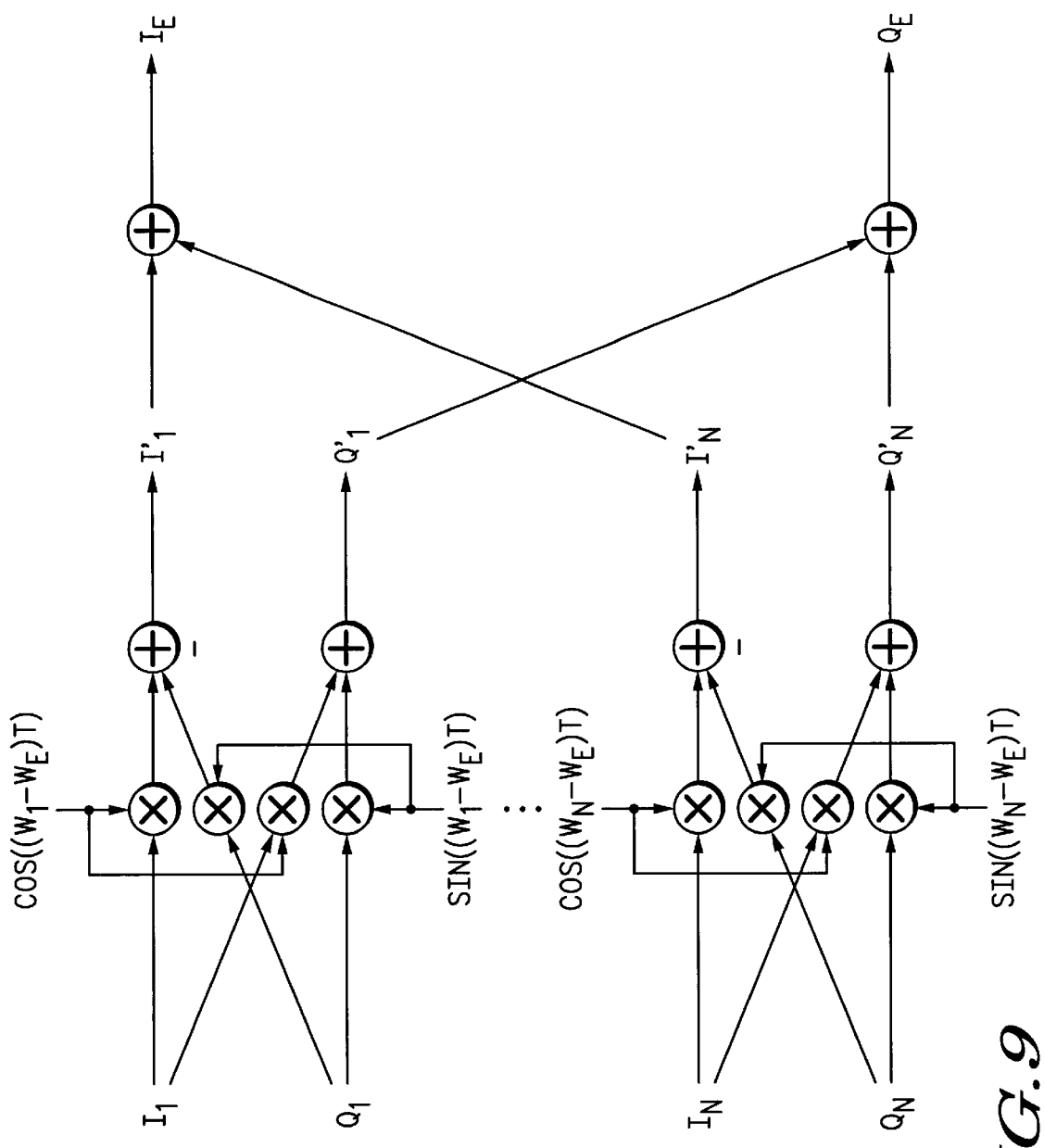
FIG. 9 illustrates the combining of multiple carrier signals into an extended baseband.

Turning now to FIG. 9 one implementation of combining circuit 806 is depicted go a generalized case of N input digital baseband signals. Combining circuit 806 generated a widened baseband signal, which is the combination of all base band signals combined with appropriate offset frequencies. For the case of two carrier signals, the analog baseband signals can be written as:

$$s_k(t) = I_k(t) + jQ_k(t); \text{ for } k=1, 2.$$

If the carrier frequencies are denoted as ($\omega$, k=1,2; then the combined RF signals is $$S_{tot}(t) = Re\{[I_1(t)+jQ_1(t)]\exp(j\omega_1 t) + [I_2(t)+jQ_2(t)]\exp(j\omega_2 t)\}$$

or $$S_{tot}(t) = Re\{([I_1(t)+jQ_1(t)]\exp(-j\omega' t) + [I_2(t)+jQ_2(t)] \exp(j\omega' t))\exp(j\omega_0 t)\}$$

where $\omega' = (\omega_1 - \omega_2)/2$ and $\omega_0 = (\omega_2 + \omega_1)/2$ Thus the combined RF signal has the form of a single widened based band signal:

$$\begin{aligned}S_{wide}(t) &= [I_1(t) + jQ_1(t)]\exp(-j\omega' t) + [I_2(t) + jQ_2(t)]\exp(j\omega' t) \\ &= [I_1(t) + I_2(t)]\cos(\omega' t) + [Q_1(t) - Q_2(t)]\sin(\omega' t) + \\ &\quad j\{[I_2(t) - I_1(t)]\sin(\omega' t) + [Q_1(t) + Q_2(t)]\cos(\omega' t)\}\end{aligned}$$

This signal is attached to effective carrier frequencies of $\omega_0$.

For the more generalized case of N equi-spaced baseband signals, each baseband signal is shifted by an amount equal the difference between the baseband signal frequency ($\omega_k$) and the "average" frequency $\Sigma\omega_k/N$ for k=1 to N.

Figure 10:
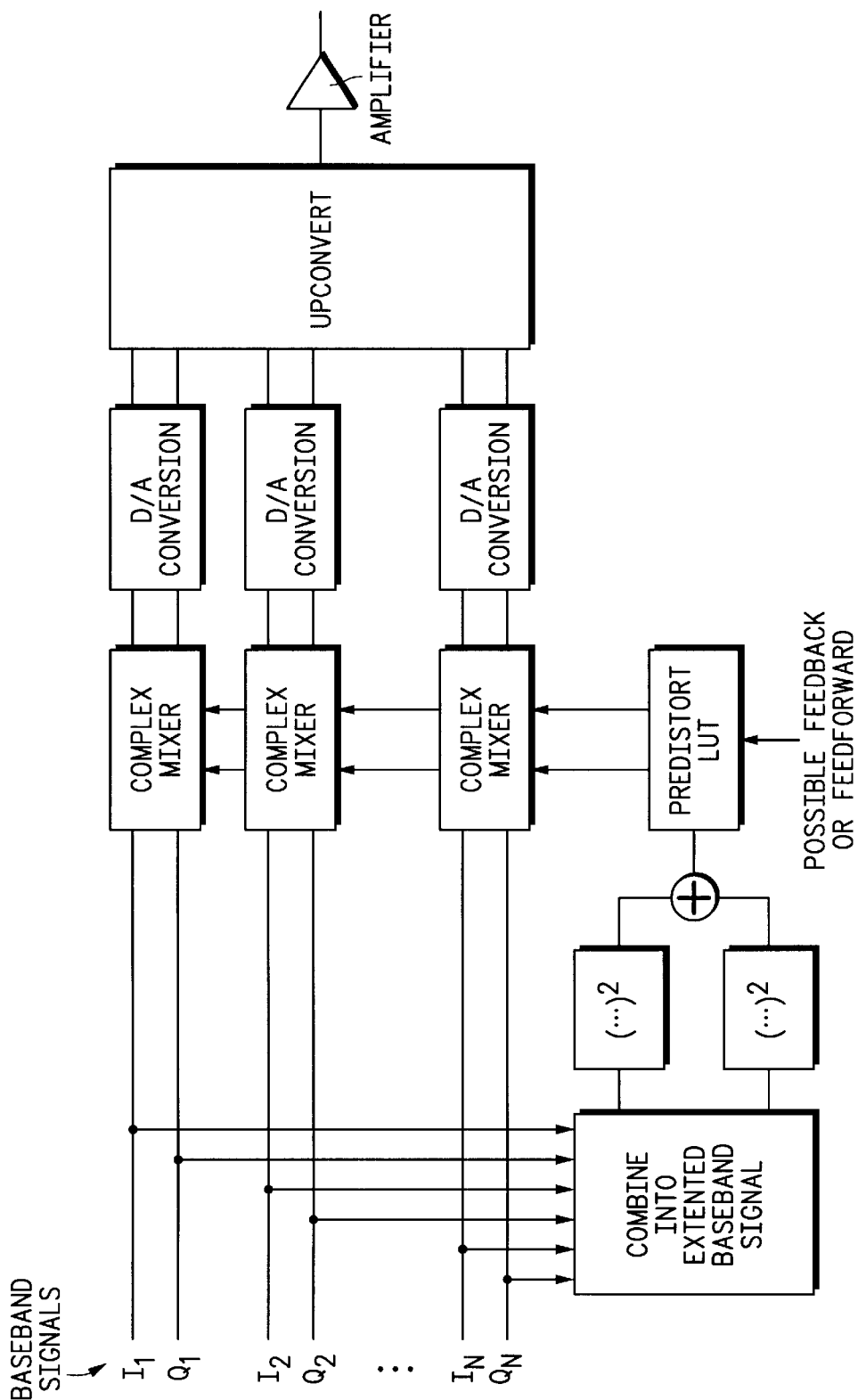
FIG. 10 is an alternative embodiment of a system for combining and predistorting multiple carrier signals prior to amplification.
Figure 11A:
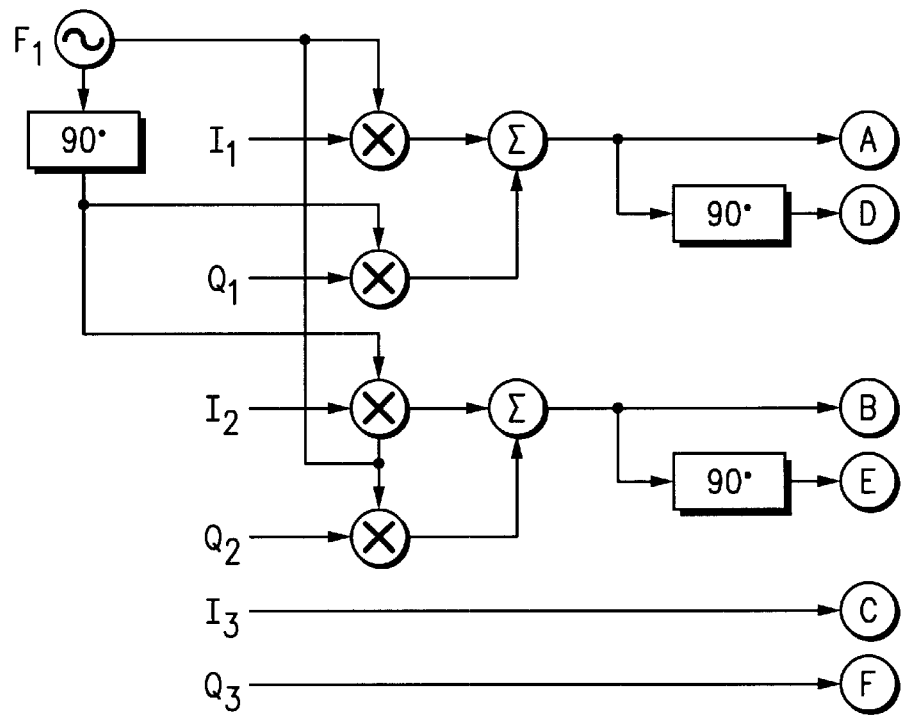
FIGS. 11A and 11B illustrate a circuit for upconverting multiple signals of FIG. 10 prior to amplification.
Figure 11B:
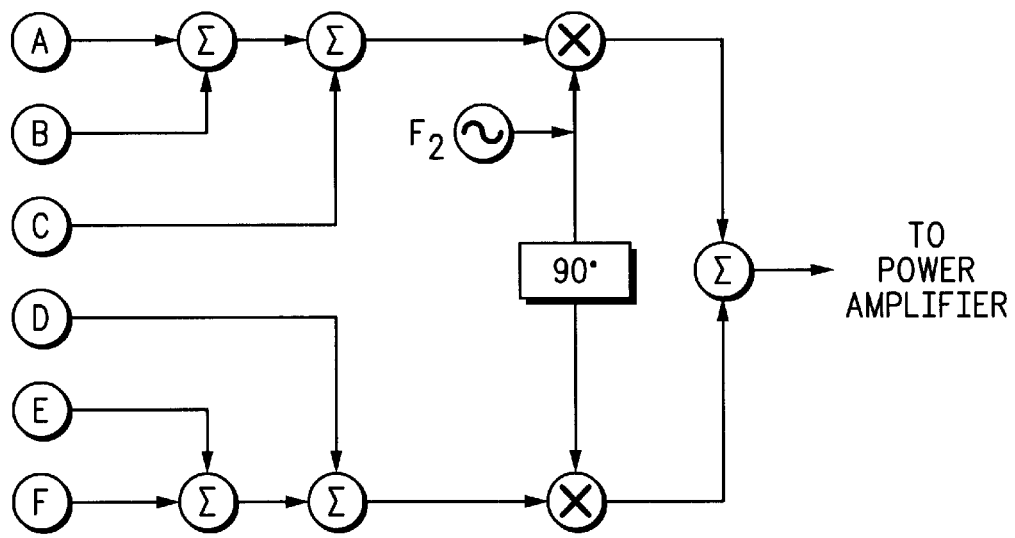

This generalized form of the equation for the widened baseband signal is achieved with the implementation of combining circuit 806 in FIG. 9 in which the inphase and quadrature components of each individual baseband signal are shifted by a frequency "delta" equal to the baseband signal frequency $\omega_1$ and the extended baseband frequency $\omega_E$ where $\omega_E$ is the average value of all individual baseband frequencies. Each of these shifted baseband signals, identified by reference numeral 902a and 902n are then combined with adder circuits to produce extended baseband signal 808. Turning now to FIG. 10, an implementation of the invention suitable for predistorting multiple baseband signals is depicted in which the output of predistortion LUT 916, which is substantially identical to predistortion circuit 816 of FIG. 8, is applied to each individual baseband signal with a set of complex mixers 918a, 918b, etc. (collectively or generically referred to as complex mixer(s) 918). The output of each of the individual mixers 918 is then converted to an analog signal and provided to an up-converter 922. FIGS. 11A and 11B depict one embodiment of up-converter 922 for the case of three equi-spaced baseband signals including a first or low frequency baseband signal (I1, Q1), a second or high frequency baseband signal (I2, Q2), and third or middle baseband frequency (I3, Q3). In this implementation, the first carrier signal ($I_1$, $Q_1$), after predistortion and analog conversion, is up-converted by the frequency F1, which represents the spacing between the frequencies of adjacent signals (i.e., $F1=\omega_1-\omega_3=\omega_2-\omega_3$), while the second carrier signal is converted down-converter by the same frequency. (Because third carrier signal ($I_3,Q_3$) is centrally spaced between first and second frequencies, it is unshifted). The shifted components of the three baseband signals are then combined as depicted in FIG 11B and further upconverted by a frequency $F_2$, which represents the average value of the three individual baseband signals.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be considered as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for linearizing an amplifier to produce an amplified output signal from a set of carrier frequencies, the method comprising:

linearly combining a set of digital baseband signals corresponding to the set of carrier frequencies to produce an extended digital baseband signal;

deriving look-up values from the power values of the extended digital baseband signal for applying to a look-up table to obtain predistortion values;

producing at least one predistorted signals by complex mixing the predistortion values with a selected one of the extended digital baseband signal and the set of digital baseband signals; and producing the amplified output signal which is linearly related to the set of digital baseband signals.

2. The method of claim 1, wherein the step of linearly combining the set of digital baseband signals further comprises:

complex mixing individual digital baseband signals of the set of digital baseband signals with trigonometric signals to produce complex mixed signals; and adding the complex mixed signals to produce the extended digital baseband signal.

3. The method of claim 1, wherein the step of producing one or more predistorted signals further comprises:

upconverting the predistorted signals synchronously when said predistorted signals are a complex mixing of the predistortion values and the set of digital baseband signals.

4. The method of claim 1, wherein the look-up table is a function of pre-measured calibration data.

5. A method for linearizing an amplifier to produce an amplified output signal from a set of carrier frequencies, the method comprising:

linearly combining a set of digital baseband signals corresponding to the set of carrier frequencies to produce an extended digital baseband signal;

computing a look-up table using power values of the extended digital baseband signal as look-up values wherein the look-up table is a function of pre-measured calibration data; and applying the look-up table to the extended digital baseband signal for producing a predistorted signal;

amplifying the predistorted signal; and producing the amplified output signal which is linearly related to the set of digital baseband signals.

6. The method of claim 5, wherein the step of linearly combining the set of digital baseband signals further comprises:

complex mixing individual digital baseband signals of the set of digital baseband signals with trigonometric signals to produce complex mixed signals; and adding the complex mixed signals to produce the extended digital baseband signal.

7. The method of claim 5, further comprising:

upconverting the predistorted signal.

8. The method of claim 5, wherein the step of computing the look-up table further comprises:

determining a set of input power values;

obtaining the pre-measured calibration data including an output power data value and phase data value of the amplifier corresponding to each of the input power values;

deriving a set of calibration power values using the output power data values;

deriving amplitude predistortion calibration values using the calibration power values and the input power values;

determining phase predistortion calibration values from the phase data values;

interpolating the calibration power values and corresponding amplitude predistortion calibration values to provide amplitude predistortion values;

interpolating the calibration power values and corresponding phase predistortion calibration values to provide phase predistortion values; and wherein the look-up table is computed from the amplitude predistortion values and the phase predistortion values.

9. The method of claim 8, wherein the amplitude predistortion values and the phase predistortion values are polar values, the method further comprising;

translating the amplitude predistortion values and the phase predistortion values from polar values to Cartesian values.

10. A method for linearizing an amplifier to produce an amplified output signal from a set of carrier frequencies, the method comprising:

linearly combining a set of digital baseband signals corresponding to the set of carrier frequencies to produce an extended digital baseband signal;

computing a look-up table using power values of the extended digital baseband signal as look-up values wherein the look-up table is a function of pre-measured calibration data; and applying the look-up table to each digital baseband signal in the set of digital baseband signals for producing a set of predistorted signals;

amplifying the set of predistorted signals; and producing the amplified output signal which is linearly related to the set of digital baseband signals.

11. The method of claim 10, wherein the step of linearly combining the set of digital baseband signals further comprises:

complex mixing individual digital baseband signals of the set of digital baseband signals with trigonometric signals to produce complex mixed signals; and adding the complex mixed signals to produce the extended digital baseband signal.

12. The method of claim 10, further comprising:

upconverting the set of predistorted signals synchronously.

13. The method of claim 10, wherein the step of computing the look-up table further comprises:

determining a set of input power values;

obtaining the pre-measured calibration data including an output power data value and phase data value of the amplifier corresponding to each of the input power values;

deriving a set of calibration power values using the output power data values;

deriving amplitude predistortion calibration values using the calibration power values and the input power values;

determining phase predistortion calibration values from the phase data values;

interpolating the calibration power values and corresponding amplitude predistortion calibration values to provide amplitude predistortion values;

interpolating the calibration power values and corresponding phase predistortion calibration values to provide phase predistortion values; and wherein the look-up table is computed from the amplitude predistortion values and the phase predistortion values.

14. The method of claim 13, wherein the amplitude predistortion values and the phase predistortion values are polar values, the method further comprising;

translating the amplitude predistortion values and the phase predistortion values from polar values to Cartesian values.

15. A semiconductor device comprising;

a signal combining element for linearly combining a set of digital baseband signals corresponding to a set of carrier frequencies to produce an extended digital baseband signal;

a memory for storing a look-up table wherein the look-up table uses power values of the extended digital baseband signal as look-up values;

at least one complex mixer for applying the look-up table to a selected one of the extended digital baseband signal and the set of digital baseband signals for producing at least one predistorted signal;

an amplifier for receiving and amplifying the at least one predistorted signal; and wherein an amplified output signal is produced which is linearly related to the digital input signals.

16. The semiconductor device of claim 15, wherein the signal combining element further comprises:

a plurality of complex mixers for mixing each digital baseband signal in the set of digital baseband signals with trigonometric signals to produce mixed signals;

a plurality of adders for adding the mixed signals to produce the extended digital baseband signal.

17. The semiconductor device of claim 15, wherein when said at least one complex mixer applies the look-up table to the extended digital baseband signal, the device further comprising:

a converter for converting the predistorted signal from digital to analog; and an unconverter for moving the predistorted signal from a baseband signal to a carrier band signal.

18. The semiconductor device of claim 15, wherein when said at least one complex mixer applies the look-up table to the set of digital baseband signals wherein a plurality of predistorted signals are produced, the device further comprising:

a converter for converting the plurality of predistorted signals from digital to analog; and an unconverter for synchronously moving the plurality of predistorted signals from baseband signals to carrier band signals.

19. The semiconductor device of claim 15, further comprising:

a power value estimator for providing a set of input power values to the look-up table.

20. The semiconductor device of claim 15, wherein the at least one complex mixer further comprises:

a plurality of multipliers.

* * * * *

UNITED STATES PATENT AND TRADEMARK OFFICE
CERTIFICATE OF CORRECTION

PATENT NO.    : 6,477,477 B1
DATED         : November 5, 2002
INVENTOR(S)   : Thron et al.

It is certified that error appears in the above-identified patent and that said Letters Patent is hereby corrected as shown below:

<u>Column 9,</u>
Line 42, change "at least one" to -- one or more --.

Signed and Sealed this

Second Day of September, 2003

JAMES E. ROGAN
*Director of the United States Patent and Trademark Office*